(12) United States Patent
Kim et al.

(10) Patent No.: US 10,892,407 B2
(45) Date of Patent: Jan. 12, 2021

(54) APPARATUS AND METHODS FOR ELECTRICAL SWITCHING

(71) Applicant: Massachusetts Institute of Technology, Cambridge, MA (US)

(72) Inventors: Jeehwan Kim, Cambridge, MA (US); Shinhyun Choi, Melrose, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/146,438

(22) Filed: Sep. 28, 2018

(65) Prior Publication Data

US 2019/0036021 A1 Jan. 31, 2019

Related U.S. Application Data

(62) Division of application No. 15/388,785, filed on Dec. 22, 2016, now Pat. No. 10,115,894.

(Continued)

(51) Int. Cl.
*H01L 45/00* (2006.01)
*G11C 13/00* (2006.01)
(Continued)

(52) U.S. Cl.
CPC .......... *H01L 45/08* (2013.01); *G11C 13/004* (2013.01); *G11C 13/0011* (2013.01); *G11C 13/0069* (2013.01); *H01L 27/2472* (2013.01); *H01L 29/0607* (2013.01); *H01L 45/085* (2013.01); *H01L 45/1266* (2013.01);
(Continued)

(58) Field of Classification Search
CPC . H01L 45/08; H01L 27/2472; H01L 29/0607; G11C 13/004
See application file for complete search history.

(56) References Cited

U.S. PATENT DOCUMENTS 4,010,482 A 3/1977 Abbas et al.
4,503,521 A 3/1985 Schick et al.
(Continued)

FOREIGN PATENT DOCUMENTS

WO WO 2018/125519 A1 7/2018

OTHER PUBLICATIONS

International Search Report and Written Opinion dated Apr. 14, 2017 for Application No. PCT/US2016/068274.
(Continued)

*Primary Examiner* — Elias Ullah
(74) *Attorney, Agent, or Firm* — Wolf, Greenfield & Sacks, P.C.

(57) ABSTRACT

Electrical switching technologies employ the otherwise undesirable line defect in crystalline materials to form conductive filaments. A switching cell includes a crystalline layer disposed between an active electrode and another electrode. The crystalline layer has at least one channel, such as a line defect, extending from one surface of the crystalline layer to the other surface. Upon application of a voltage on the two electrodes, the active electrode provides metal ions that can migrate from the active electrode to the other electrode along the line defect, thereby forming a conductive filament. The switching cell can precisely locate the conductive filament within the line defect and increase the device-to-device switching uniformity.

20 Claims, 31 Drawing Sheets

Related U.S. Application Data

(60) Provisional application No. 62/352,306, filed on Jun. 20, 2016.

(51) Int. Cl.
   *H01L 27/24* (2006.01)
   *H01L 29/06* (2006.01)

(52) U.S. Cl.
   CPC .. *H01L 45/1675* (2013.01); *G11C 2013/0045* (2013.01); *G11C 2013/0073* (2013.01); *G11C 2213/11* (2013.01); *G11C 2213/33* (2013.01); *H01L 45/1246* (2013.01); *H01L 45/148* (2013.01)

(56) References Cited

U.S. PATENT DOCUMENTS

| | | | |
|---|---|---|---|
| 8,450,711 | B2 | 5/2013 | Williams et al. |
| 9,224,951 | B1 * | 12/2015 | Wang ............... H01L 45/145 |
| 9,793,473 | B2 | 10/2017 | Wang et al. |
| 10,115,894 | B2 | 10/2018 | Kim et al. |
| 10,164,179 | B2 | 12/2018 | Brew et al. |
| 2005/0226067 | A1 | 10/2005 | Herner et al. |
| 2006/0221555 | A1 | 10/2006 | Pinnow |
| 2007/0029538 | A1 | 2/2007 | Pinnow |
| 2008/0274585 | A1 | 11/2008 | Lung et al. |
| 2012/0008366 | A1 | 1/2012 | Lu |
| 2012/0043519 | A1 | 2/2012 | Jo et al. |
| 2012/0074372 | A1 | 3/2012 | Yang et al. |
| 2013/0062587 | A1 | 3/2013 | Lee et al. |
| 2013/0277638 | A1 | 10/2013 | Moradpour et al. |
| 2014/0175362 | A1 | 6/2014 | Tendulkar et al. |
| 2014/0264238 | A1 | 9/2014 | Jo |
| 2014/0301138 | A1 | 10/2014 | Mani |
| 2015/0035098 | A1 | 2/2015 | Mani |
| 2015/0078065 | A1 | 3/2015 | Vianello et al. |
| 2015/0357566 | A1 | 12/2015 | Wang et al. |
| 2017/0317141 | A1 | 11/2017 | Bedau |
| 2017/0365778 | A1 | 12/2017 | Kim et al. |

OTHER PUBLICATIONS

International Preliminary Report on Patentability dated Jan. 3, 2019 for Application No. PCT/US2016/068274.

Choi et al., SiGe epitaxial memory for neuromorphic computing with reproducible high performance based on engineered dislocations. Nat Mater. Apr. 2018;17:335-40. Suppl Materials, 1 pg.

Jo et al., Nanoscale memristor device as synapse in neuromorphic systems. Nano Lett. Apr. 14, 2010;10(4):1297-301. doi: 10.1021/nl904092h.

Kim et al., Tuning resistive switching characteristics of tantalum oxide memristors through Si doping. ACS Nano. Oct. 28, 2014;8(10):10262-9. doi: 10.1021/nn503464q. Epub Sep. 29, 2014.

Liu et al., Percolation network in resistive switching devices with the structure of silver/amorphous silicon/p-type silicon. Appl Phys Lett. 2014;104:043502(1-4). Epub Jan. 29, 2014.

Manoj et al., Aqueous electrolyte system for porous silicon using electrochemical anodization. 2013 IEEE Intl Conf Electro/Information Technol (EIT). May 2013. doi: 10.1109/385.2013/6632656. 4 pages.

Pan et al., Recent progress in resistive random access memories: Materials, switching mechanisms, and performance. Mater Sci Eng R Rpts. Sep. 2014;83(1):1-59.

Scheeler et al., Fabrication of porous silicon by metal-assisted etching using highly ordered gold nanoparticle arrays. Nanoscale Res Lett. Aug. 9, 2012;7(1):450. doi: 10.1186/1556-276X-7-450.

Valov et al., Electrochemical metallization memories—fundamentals, applications, prospects. Nanotechnol. Jun. 2011;22(25):254003(1-22). Epub May 16, 2011.

Wang et al., Engineering incremental resistive switching in TaOx based memristors for brain-inspired computing. Nanoscale. Aug. 7, 2016;8(29):14015-22. doi: 10.1039/c6nr00476h. Epub May 4, 2016.

EP 16906491.2, Jan. 28, 2020, Extended European Search Report.

Extended European Search Report dated Jan. 28, 2020 for Application No. EP 16906491.2.

Szot et al., Switching the electrical resistance of individual dislocations in single-crystalline $SrTiO_3$. Nat Mater. Apr. 2006;5:312-29. doi: 10.1038/nmat1614. Epub Mar. 26, 2006.

* cited by examiner

600

635
630

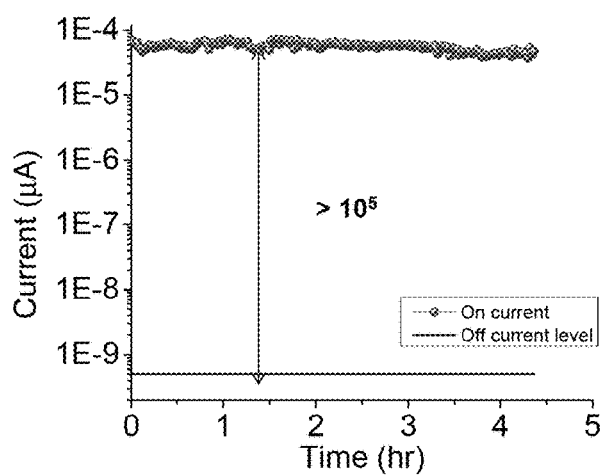 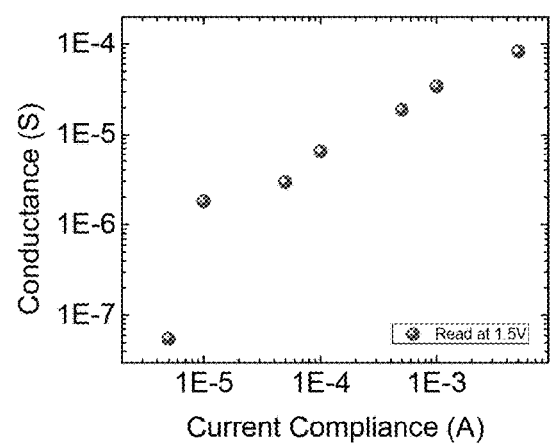
*FIG. 12D*  *FIG. 12E*

APPARATUS AND METHODS FOR ELECTRICAL SWITCHING

CROSS-REFERENCE TO RELATED APPLICATION(S)

This application is a divisional of U.S. application Ser. No. 15/388,785, entitled "APPARATUS AND METHODS FOR ELECTRICAL SWITCHING" and filed Dec. 22, 2016, which claims priority to U.S. Application No. 62/352,306, filed Jun. 20, 2016, entitled "PRECISE CONFINEMENT OF CONDUCTIVE FILAMENT IN ECM (ELECTROCHEMICAL METALLIZATION) RRAM (RANDOM READ ACCESS MEMORY)." Each of these applications is hereby incorporated herein by reference in its entirety.

BACKGROUND

A lion's share of current state-of-the-art nonvolatile memory is silicon-based flash memory due to its high density and low cost. However, flash memories have several disadvantages, such as low operation speed (e.g., write/erase times of about 1 ms/0.1 ms), poor endurance (e.g., about $10^6$ write/erase cycles), and high write voltage (e.g., greater than 10 V). Moreover, flash memories may reach the miniaturization limit in the near future due to large leakage currents.

One technology that may overcome the disadvantages of flash memories is resistive random access memory (RRAM). In general, a RRAM cell includes an insulator or semiconductor sandwiched between two conductors. The underlying physical mechanism of RRAM is usually resistive switching (RS), which allows the cell to be freely programmed into a high resistance state (HRS, or OFF state) or a low resistance state (LRS, or ON state) under external electrical stimuli. In most cases, current flows uniformly through the device in the HRS and is restricted to a local region with high conductance known as a conducting filament (CF) in the LRS. The simple structure of RRAM enables easy integration in passive crossbar arrays with a small size of $4F^2$ (F is the minimum feature size). The size can be further reduced to $4F^2/n$ within vertically stacked three-dimensional (3-D) architectures (n is the stacking layer number of the crossbar array).

However, RRAMs have their own limitations. For example, current RRAMs typically use amorphous materials as the switching medium disposed between electrodes. During switching events, conductive filaments can be formed anywhere within the amorphous material. As a result, it can be difficult to accurately locate or confine the conductive filament. In addition, the random formation of conductive filaments in RRAMs can also reduce the uniformity (and increase the variance) of performance among different cells. The increased individual variability of RRAM cells can in turn limit wide spread applications.

SUMMARY

Embodiments of the present invention include apparatus, systems, and methods for electrical switching. In one example, an apparatus for electrical switching includes a crystalline layer having a first side and a second side opposite the first side. The crystalline layer has at least one channel extending from the first side to the second side. The apparatus also includes a first electrode disposed on the first side of the crystalline layer and a second electrode disposed on the second side of the crystalline layer. The first electrode has a first solid solubility less than 1% in the crystalline layer and the second electrode has a second solid solubility less than 1% in the crystalline layer. The first electrode includes an active material to provide at least one metal ion migrating along the at least one channel in response to a first voltage applied across the first electrode and the second electrode.

In another example, a method of actuating a device of electrical switching is disclosed. The device includes a crystalline layer having at least one channel extending from a first side of the crystalline layer to a second side of the crystalline layer, a first electrode including an active material and disposed on the first side, and a second electrode disposed on the second side. The method includes applying a first voltage, having a first sign, between the first electrode and the second electrode. The first voltage causes a plurality of metal ions to form a conductive filament extending between the first electrode and the second electrode along the at least one channel.

In yet another example, an electrical switching device includes a switching medium comprising crystalline SiGe and has a first side and a second side. The switching medium has a thickness of about 10 nm to about 100 nm and at least one line defect extending from the first side to the second side. The at least one line defect has a width of about 0.1 nm to about 5 nm. The electrical switching device also includes a first electrode including an active material and disposed on the first side of the switching medium. The first electrode has a first solid solubility less than 1% in the switching medium. The electrical switching device also includes a second electrode disposed on the second side of the crystalline layer. The second electrode has a second solid solubility less than 1% in the crystalline layer. A plurality of metal ions from the first electrode is configured to migrate along the at least one line defect to form a conductive filament in the at least one line defect in response to a first voltage applied between the first electrode and the second electrode. The plurality of metal ions is configured to retreat back to the first electrode in response to a second voltage applied between the first electrode and the second electrode, the second voltage having a second polarity opposite to a first polarity of the first voltage.

In yet another example, a method of fabricating an electrical switching device includes forming a crystalline layer on a conductive substrate. The crystalline layer has a first side on the conductive substrate and a second side opposite the first side. The crystalline layer has at least one channel extending from the first side to the second side. The method also includes forming an electrode, comprising an active material, on the second side of the crystalline layer. The electrode has a first solid solubility less than 1% in the crystalline layer.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 12D is a plot showing the electrical current of the switching device shown in FIG. 1 at ON and OFF states over more than 4.5 hours of continuous operation.

FIG. 12E shows conductance as a function of current compliance of the switching device shown in FIG. 1.

DETAILED DESCRIPTION

Electrical Switching with Confined Conductive Filaments

To address issues arising out of the random formation of conductive filaments in RRAMs, apparatus, systems, and methods described herein employ otherwise undesirable line defects (also referred to as dislocations) in crystalline materials to form conductive filaments. Based on this approach, a switching cell (also referred to as a switching element, switching device, or switch) includes a crystalline layer disposed between an active electrode and another electrode. The crystalline layer has at least one line defect extending from one surface of the crystalline layer to the other surface. Applying a voltage across on the two electrodes causes metal ions to migrate from the active electrode to the other electrode along the line defect, thereby forming a conductive filament within the lines defect.

The growth of conductive filament modulates the overall resistance of the switching cell, thereby controlling the switching status of the switching cell. In general, the formation of the conductive filament puts the switching cell in an ON state. Upon application of another voltage of a different sign, the ions migrate back to the active electrode, thereby putting the switching cell into an OFF state. Using dislocations as the channel for conductive filaments can precisely control the location and size of the conducting filament. The well-defined conductive filament can in turn improve the device-to-device uniformity. In addition, the uniformity of performance of each device can also be improved.

Figure 1A:
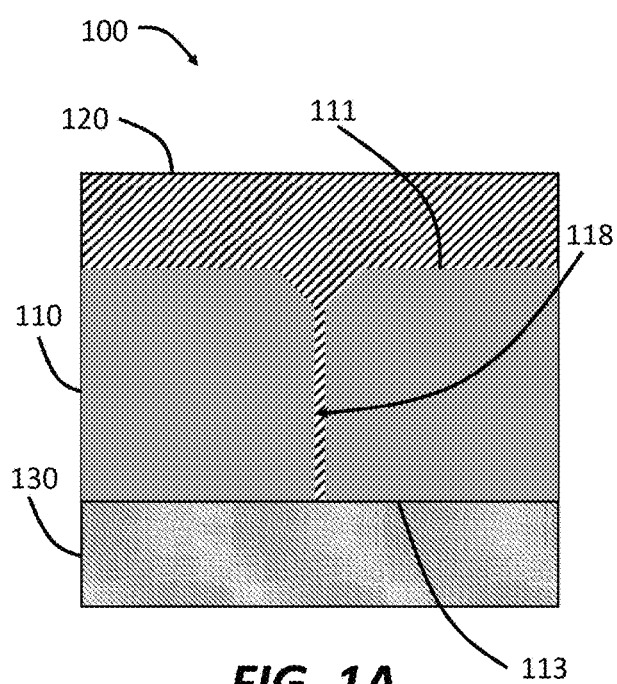
FIGS. 1A and 1B show a schematic of an electrical switch apparatus, in ON and OFF state, respectively, using a line defect to guide and formation of conductive filaments.
Figure 1B:
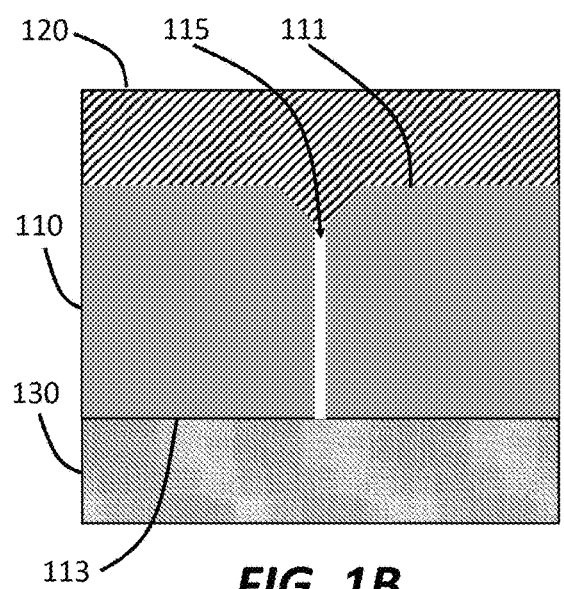

FIGS. 1A and 1B show schematics of an apparatus 100 for electrical switching in ON and OFF state, respectively. The apparatus 100 includes a crystalline layer 110 (also referred to as switching medium) having a first side 111 (also referred to as a first surface 111) and a second side 113 (also referred to as a second surface 113). An active electrode 120 is disposed on the first side 111 of the crystalline layer 110 and a base electrode 130 is disposed on the second side 113 of the crystalline layer 110. The solid solubility of the active electrode 120 in the crystalline layer 110 is less than 1% to reduce compound formation between the active electrode 120 and the crystalline layer 110. Similarly, the solid solubility of the base electrode 130 in the crystalline layer 120 is also less than 1%. The crystalline layer 110 has a channel 115, such as a line defect 115, extending substantially through the thickness of the crystalline layer 110 (see FIG. 1B).

The active electrode 120 is made of an active material, which can be defined as any material that can provide ions in response to an applied voltage. In other words, applying a voltage across the two electrodes 120 and 130 causes ions to migrate from the active electrode 120 along the line defect 115 and form a conductive filament 118 in the line defect 115 (see, FIG. 1A). The formation of the conductive filament can decrease the resistivity of the crystalline layer 110, thereby causing the apparatus 100 to be in the ON state (i.e., turning on the switch), as illustrated in FIG. 1A.

Upon removal of the voltage applied between the two electrodes 120 and 130, the conductive filament usually remains within the line defect 115. Therefore, memory made of switch apparatus 100 can be nonvolatile. This is because upon removing the power supply of the memory, the stored information (e.g., 0 or 1) in the form of switching state of each switch cell (e.g., ON or OFF) remains in the memory. In other words, the memory does not erase data stored in the memory upon power outage.

The apparatus 100 can be switched off by applying another voltage having an opposite polarity (also referred to as an opposite sign). In response to the voltage of an opposite polarity, the metal ions that form the conductive filament retreat back to the active electrode 120, thereby leaving a substantially empty line defect 115, as shown in FIG. 1B. This dissolution of the conductive filament increases the resistivity of the crystalline layer 110, thereby causing the apparatus 100 to be in the OFF state.

Various materials can be used to form the crystalline layer 110. In one example, the crystalline layer 110 includes an insulator. In another example, the crystalline layer 110 includes a group IV semiconductor, such as single-crystalline silicon and single-crystalline germanium, among others. In yet another example, the crystalline layer 110 includes a group III-V semiconductor (including III-nitride semiconductor), such as boron nitride (BN), gallium nitride (GaN), gallium arsenide (GaAs), indium nitride (InN), indium phosphide (InP), or indium arsenide (InAs), among others. In yet another example, the crystalline layer 110 includes a group II-VI semiconductor, such as cadmium selenide (CdSe), zinc oxide (ZnO), zinc selenide (ZnS), or zinc sulfide, among others.

The thickness of the crystalline layer 110 can be about 2 nm to about 1 µm (e.g., about 2 nm, about 5 nm, about 10 nm, about 20 nm, about 50 nm, about 100 nm, about 200 nm, about 500 nm, or about 1 µm, including any values and sub ranges in between). The thickness of the crystalline layer 110 can also be less than 2 nm or greater than 1 µm, depending on the desired performance of the resulting switch. For example, decreasing the thickness of the crystalline layer 110 can decrease the distance for metal ions to migrate from the active electrode 120 to reach the base electrode 130, thereby increasing the switching speed. On the other hand, increasing the thickness of the crystalline layer 110 can decrease the probability of conductive filament formation at a location outside the line defect 115 due to, for example, discharge. This can in turn improve the stability of the resulting switch.

In one example, the line defect 115 is all the way through the crystalline layer 110. In other words, the line defect 115 extends from the first side 111 of the crystalline layer 110 to the second side 112 of the crystalline layer 110 (i.e. the length of the line defect 115 is substantially the same as the thickness of the crystalline layer 110). In another example, the line defect 115 extends substantially through crystalline layer 110. Stated differently, the length of the line defect 115 can be less than the thickness of the crystalline layer 110. The ratio of the length of the line defect 115 to the thickness of the crystalline layer 110 can be about 50% to about 99% (e.g., about 50%, about 60%, about 70%, about 80%, about 90%, about 95%, about 97%, or about 99%, including any values and sub ranges in between).

The lateral dimension of the line defect 115 (also referred to as the lateral size, such as diameter or width) can be about 0.1 nm to about 30 nm (e.g., about 0.1 nm, about 0.2 nm, about 0.5 nm, about 1 nm, about 2 nm, about 3 nm, about 4 nm, about 5 nm, about 10 nm, about 20 nm, or about 30 nm, including any values and sub ranges in between). The cross section of the line defect 115 can be, for example, round, square, polygonal, or any other appropriate shape.

The apparatus 100 shown in FIG. 1 includes only one line defect 115. In practice, the apparatus 100 can include multiple line defects 115. Memory made of the apparatus 100 usually includes an array of the apparatus 100. Each apparatus 100 includes at least one line defect and the collection of the line defects in the memory can also form an array. In either case, the density of the line defects can be about $10^2$ line defects per µm$^2$ to about $10^6$ line defects per µm$^2$ (e.g., $10^2$ µm$^{-2}$, $10^3$ µm$^{-2}$, $10^4$ µm$^{-2}$, $10^5$ µm$^{-2}$, or about $10^6$ µm$^{-2}$, including any values and sub ranges in between).

In general, it can be beneficial for the solid solubility of the active electrode 120 in the crystalline layer 110 to be less than 1% (atomic percentage) so as to reduce the probability for the active electrode 120 to form a compound with the crystalline layer 110. In one example, the solid solubility of the active electrode 120 in the crystalline layer 110 to be less than 1% at room temperature. In another example, the solid solubility of the active electrode 120 in the crystalline layer 110 to be less than 1% at high temperature (e.g., at about 400 K, about 500 K, about 750 K, about 1000 K, or above). In yet another example, the solid solubility of the active electrode 120 in the crystalline layer 110 to be less than 0.1% (e.g., less than 0.1%, less than 0.05%, less than 0.02%, or less than 0.01%, including any values and sub ranges in between) at room temperature. In yet another example, the solid solubility of the active electrode 120 in the crystalline layer 110 to be less than 0.1% at high temperature (e.g., at about 400 K, about 500 K, about 750 K, about 1000 K, or above).

The active material in the active electrode 120 can include a metal, such as silver (Ag), aluminum (Al), gold (Au), indium (In), Tin (Sn), zinc (Zn), or any other active material known in the art.

The thickness of the active electrode 120 can be about 5 nm to about 10 µm (e.g., about 5 nm, about 10 nm, about 20 nm, about 50 nm, about 100 nm, about 200 nm, about 500 nm, about 1 µm, about 2 µm, about 3 µm, about 4 µm, or about 5 µm, including any values and sub ranges in between).

In one example, the base electrode 130 in the apparatus 100 can be a passive electrode, in which case the base electrode 130 does not provide conductive ions (or other charged particles) to form filaments in the crystalline layer 110. In another example, the base electrode 130 can also be an active electrode. The material of the base electrode 130 can be selected from a wide range of materials. In one example, the base electrode 130 includes metal materials, such as gold, platinum copper, tantalum, tin, tungsten, titanium, tungsten, cobalt, chromium, silver, nickel or aluminum, or a binary or ternary system of any of these conductive materials. In another example, the base electrode includes a conductive metal oxide, such as TiN, TiB$_2$, MoSi$_2$, n-BaTiO$_3$, (Fe, Ti)$_2$O$_3$, ReO$_3$, RuO$_2$, and IrO$_2$, among others. In yet another example, the base electrode 130 can include carbon-based conductive materials, such as graphene.

The solid solubility of the base electrode 130 in the crystalline layer 110 can be less than 1% (e.g., less than 1%, less than 0.5%, less than 0.2%, less than 0.1%, less than 0.05%, or less than 0.01%, including any values and sub ranges in between). This low solubility can be at room temperature or at high temperature (e.g., at about 400 K, about 500 K, about 750 K, about 1000 K, or above).

In one example, the solid solubility of the active electrode 120 in the crystalline layer 110 (referred to as the first solid solubility) can be the same as the solid solubility of the base electrode 130 in the crystalline layer 110 (referred to as the second solid solubility). In another example, the first solid solubility can be different than the second solubility.

The thickness of the base electrode 130 can be about 5 nm to about 10 µm (e.g., about 5 nm, about 10 nm, about 20 nm, about 50 nm, about 100 nm, about 200 nm, about 500 nm, about 1 µm, about 2 µm, about 3 µm, about 4 µm, or about 5 μm, including any values and sub ranges in between). In one example, the two electrodes 120 and 130 can have the same thickness. In another example, the two electrodes 120 and 130 can have different thicknesses.

Electrical Switching with Resistive Layer

Figure 2:
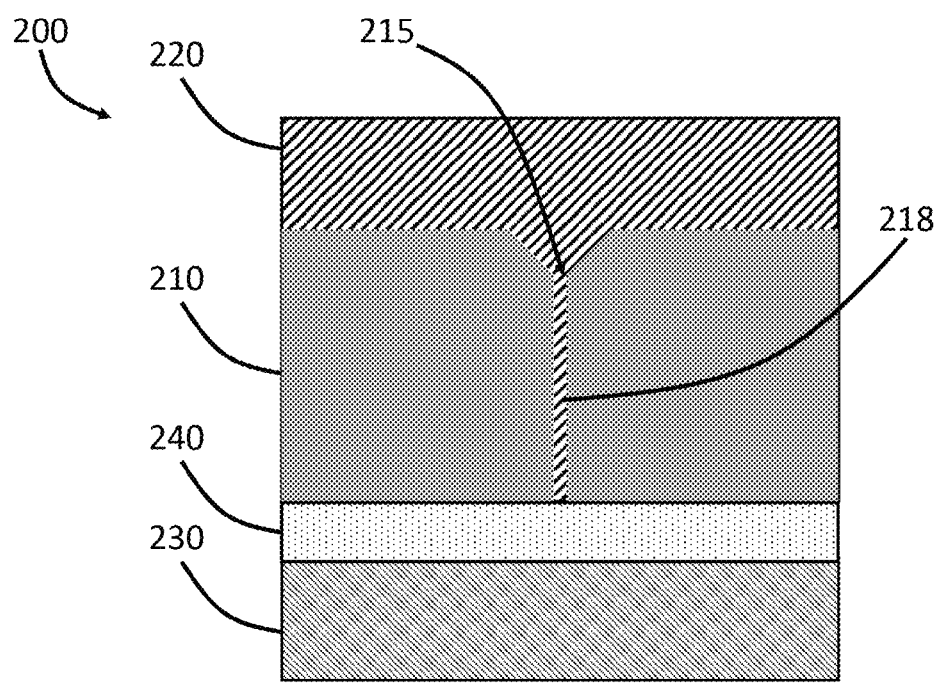
FIG. 2 shows a schematic of an electrical switch apparatus including a resistive layer to control the conductivity of the switching medium.

FIG. 2 shows a schematic of an apparatus 200 including a resistive layer 240 to control the resistivity of the apparatus 200. The apparatus 200 includes a crystalline layer 210 disposed between an active electrode 220 and the resistive layer 240. A base electrode 230 is disposed on the resistive layer 240. The crystalline layer 210 has a line defect 215 extending substantially through the thickness of the crystalline layer 210. In contrast, the resistive layer 240 does not have a line defect. As a result, a conductive filament 218 formed within the line defect 215 stops at or before the resistive layer 240 is a result. The apparatus 200 has a higher resistivity in its ON state than the apparatus 100 in FIG. 1.

The resistive layer 240 can be made of an intrinsic semiconductor (e.g., intrinsic silicon) and the base electrode 230 can be made a doped semiconductor (e.g., $p^+$ silicon). In this configuration, the resistive layer 240 reduces the bulk leakage current of the apparatus 200 by reducing discharge between the two electrodes 220 and 230.

The thickness of the resistive layer 240 can be about 1 nm to about 5 nm (e.g., about 1 nm, about 2 nm, about 3 nm, about 4 nm, or about 5 nm, including any values and sub ranges in between).

Electrical Switching with Blocking Layer

Figure 3:
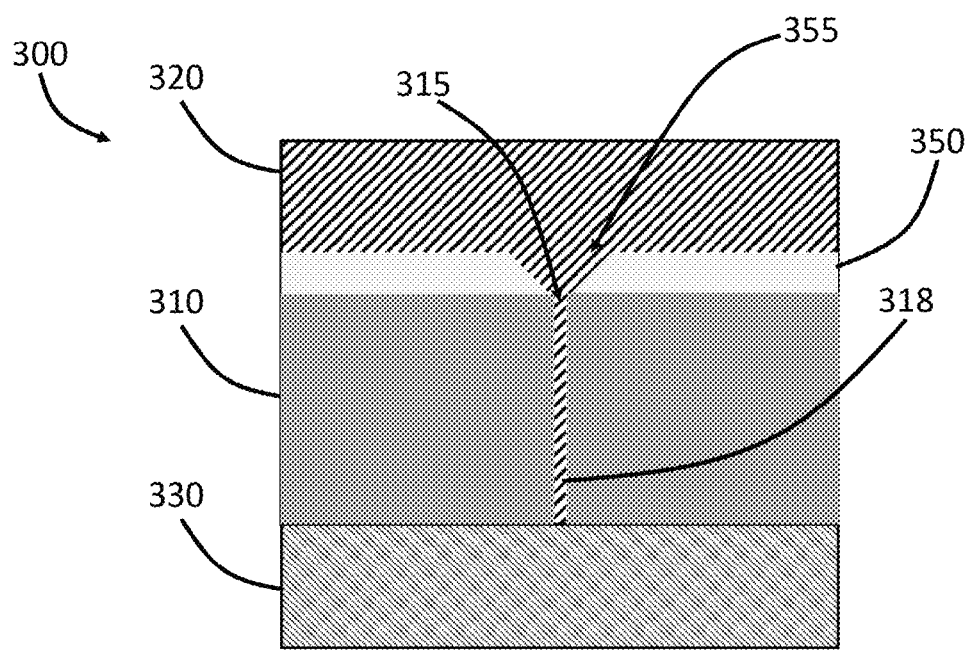
FIG. 3 shows a schematic of an electrical switch apparatus including a blocking layer to decrease bulk leakage current.

FIG. 3 shows a schematic of an apparatus 300 including a blocking layer 350 to reduce bulk leakage current of the apparatus 300. The apparatus 300 includes a crystalline layer 310 disposed between the blocking layer 350 and the base layer 330. An active electrode 320 is disposed on the blocking layer 350. The crystalline layer 310 has a line defect 315 extending substantially through the thickness of the crystalline layer 310. The blocking layer 350 also has an opening 355 (which can also be a line defect) aligned with the line defect 315 such that a continuous conductive filament 318 can be formed between the two electrodes 320 and 330. The blocking layer 350 can reduce the possibility of discharge between the two electrodes 320 and 330 at locations outside the line defect 315, thereby reducing bulk leakage current of the apparatus 300.

In one example, the blocking layer 350 and the crystalline layer 310 can form a p-n junction. For example, the blocking layer 350 can be doped with a p-type dopant and the crystalline layer 310 can be doped with an n-type dopant. In another example, the blocking layer 350 can be doped with an n-type dopant and the crystalline layer 310 can be doped with a p-type dopant. The p-n junction can further reduce bulk leakage current of the apparatus 300.

The thickness of the blocking layer 350 can be about 1 nm to about 5 nm (e.g., about 1 nm, about 2 nm, about 3 nm, about 4 nm, or about 5 nm, including any values and sub ranges in between).

In one example, the apparatus 300 can include just one blocking layer 350. In another example, the apparatus 300 can include multiple blocking layers 350. For example, the apparatus 300 may include two blocking layers 350, including a doped blocking layer and an intrinsic blocking layer, such that they can form a PIN junction with the crystalline layer 310. In yet another example, the crystalline layer 310 can be sandwiched between two blocking layers 350 (one on the top and the other on the bottom of the crystalline layer 310).

The apparatus 300 can also include a resistive layer (not shown in FIG. 3) that is substantially identical to the resistive layer 240 shown in FIG. 2 and described above.

Electrical Switching with Other Types of Channels

In the apparatus 100, 200, and 300 shown in FIGS. 1-3, respectively, and described above, confinement of the conductive filaments is achieved by ion migration along line defects (i.e., 115, 215, and 315) in crystalline layers. Alternatively, precise confinement of conductive filaments can also be achieved using other channels in the switching medium.

In one example, the crystalline layers (i.e. 110, 210, and 310 shown in FIGS. 1-3) can be replaced by a porous silicon layer. Pores in the porous silicon layer can be used as channels for metal ions from the active electrodes (i.e. 120, 220, and 320) to form one or more conductive filaments.

In another example, gold nanoparticle catalytic etching can be used to create channels in materials such as silicon (described below). The created channels can then provide the path for ions from the active electrodes (i.e. 120, 220, and 320) to form conductive filaments.

In yet another example, the crystalline layers (i.e. 110, 210, and 310 shown in FIGS. 1-3) can be replaced by a layer made of anodized aluminum. As understood in the art, anodized aluminum can be porous, thereby providing ion migration channels to form conductive filaments.

Methods of Fabricating Switching Devices Based on Line Defects

Figure 4A:
FIGS. 4A-4E illustrate a method of fabricating an electrical switch apparatus including a line defect.

FIGS. 4A-4E illustrate a method 400 of fabricating switching devices using line defects for generating conductive filaments. As shown in FIG. 4A, the method 400 includes preparing a substrate 410, which can be made of a conductive material that can be used in the base electrode 130 as described above (e.g., metal, conductive metal oxide, carbon-based material, etc.). The substrate 410 can be an epitaxial layer with a lattice structure.

Figure 4B:
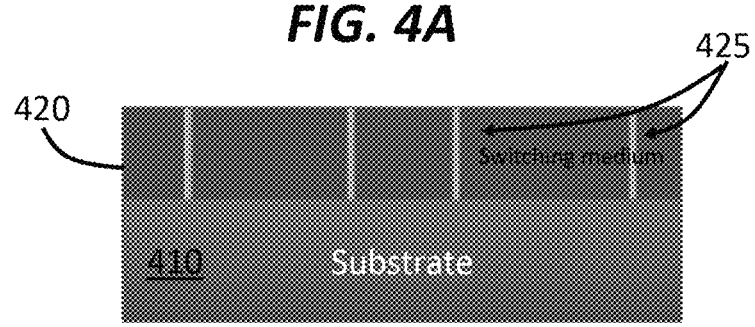

FIG. 4B shows that a crystalline layer 420 (also referred to as the switching medium) is epitaxially grown on the substrate 410. The crystalline layer 420 also has a lattice structure, which is different from the lattice structure of the substrate 410, thereby creating one or more line defects 425 in the crystalline layer 420. The density of the line defects 425 can be adjusted by changing the lattice mismatch between the crystalline layer 420 and the substrate 410. In general, a larger lattice mismatch can result in a higher density of line defects 425.

An optional step of dislocation opening can also be performed via a selective etching technique, such as Schimmel etching or Secco etching. In the Si and Ge, Schimmel etching and Secco etching can preferentially etch the line defects over the bulk material. The selecting etching can ensure that the line defects 425 have openings at the top surface of the crystalline layer 420 so as to facilitate formation of conductive filaments by receiving metal ions from active electrodes disposed above (see, e.g., FIG. 4E and description below). Selective etching can also control the lateral dimension of the line defects 425 (e.g., enlarging the opening of the line defects 425). In general, increasing the etching time increases the lateral dimension of the line defects 425.

Another optional step of forming a resistive layer (not shown in FIG. 4B) can also be performed before the crystalline layer 420 is grown. The resistive layer can be substantially identical to the resistive layer 240 shown in FIG. 2 and described above.

Figure 4C:
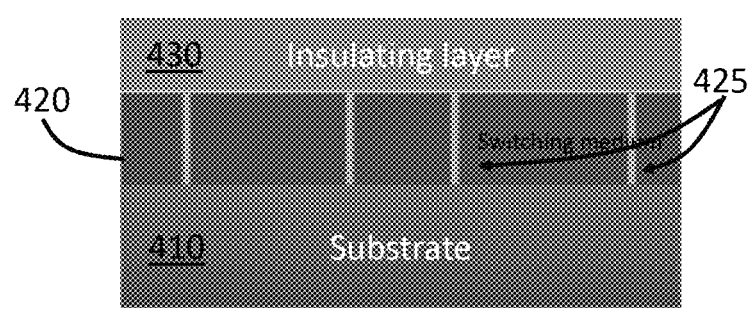

FIG. 4C shows that an insulating layer 430 is disposed on the crystalline layer 420. In one example, the insulating layer 430 can be disposed via chemical deposition. In another example, the insulating layer 430 can be disposed via physical deposition. In yet another example, the insulating layer 430 can be disposed on the switching medium 420 via epitaxial growth. In yet another example, the insulating layer 430 can be disposed via electrodeposition. In yet another example, the insulating layer 430 can be disposed via thermal oxidation.

The insulating layer 430 can include various types of materials, such as dielectric material, poly-crystalline materials, and polymers. For example, the insulating layer 430 can include $SiO_2$. In another example, the insulating layer 430 can include $Al_2O_3$. In yet another example, the insulating layer 430 can include $HfO_2$. In yet another example, the insulating layer 430 can include poly-silicon. In yet another example, the insulating layer 430 can include porcelain. In yet another example, the insulating layer 430 can include ethylene-propylene rubbers (EPM). In yet another example, the insulating layer 430 can include ethylene-propylene-diene rubber (EPDM).

Figure 4D:
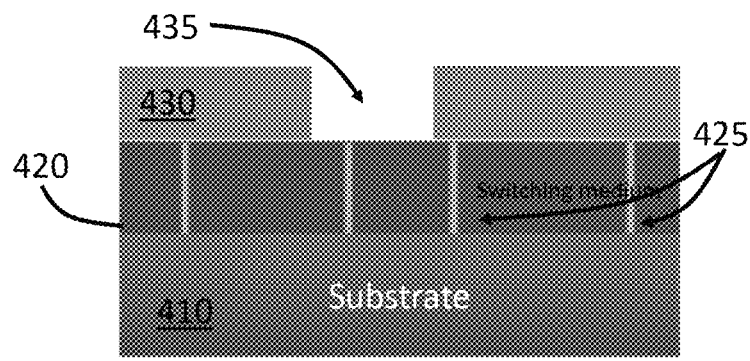

In FIG. 4D, an opening 425 (also referred to as a cavity 425) is created in the insulating layer 420. In one example, the opening 425 can be created via wet etching. In another example, the opening 425 can be created via dry etching. The opening 425 exposes at least one line defect 425 for further processing, such as forming an active electrode.

Figure 4E:
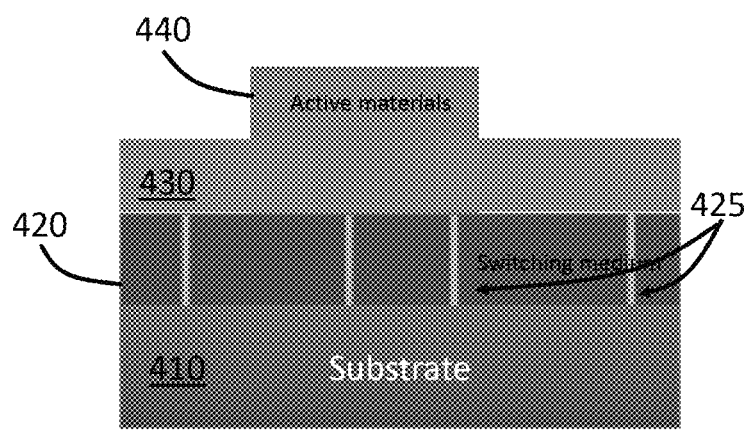

In FIG. 4E, an active material is deposited into the opening 425 to form an active electrode 440. The active material can include, for example, silver (Ag), aluminum (Al), gold (Au), indium (In), Tin (Sn), zinc (Zn), or any other active material known in the art.

An optional step of forming a blocking layer can be performed before the active electrode 440 is formed. The blocking layer can be deposited on crystalline layer 420. The active material is then deposited on the blocking layer. The blocking layer can be substantially identical to the blocking layer 350 shown in FIG. 3 and described above.

Methods of Fabricating an Array of Switching Devices

Figure 5A:
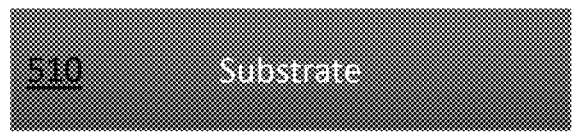
FIGS. 5A-5G illustrate a method of fabricating an array of electrical switch apparatus including line defects.

FIGS. 5A-5G illustrate a method 500 of fabricating an array of switching devices so as to, for example, facilitate mass production of the switching devices. As shown in FIG. 5A, a substrate 510 is prepared. The substrate 510 can include an intrinsic or non-conducting epitaxial material and function as a platform for subsequent steps of fabrications.

Figure 5B:
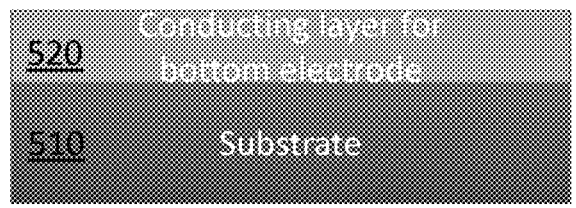

FIG. 5B shows that a conductive layer 520 is epitaxially grown on the substrate 510. The conductive layer 520 (or at least a portion of the conductive layer 520) can function as the base electrode (e.g., base electrode 130) in the resulting electrical switch.

Figure 5C:
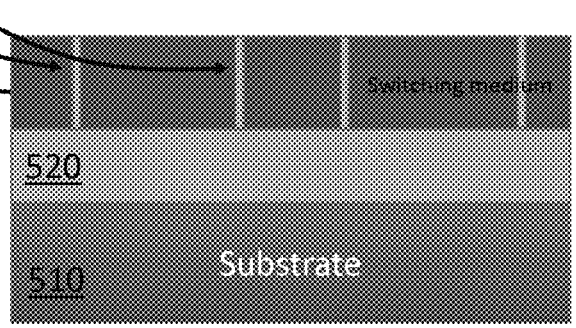

FIG. 5C shows that a crystalline layer 530 is epitaxially grown on the conductive layer 520. The crystalline layer 530 and the conductive layer 520 have a lattice mismatch such that the crystalline layer 520 has line defects 535. The amount of mismatch can be adjusted to change the density of the line defects 535. In addition, etching steps can be carried out to create openings of the line defects 535 and/or change the lateral size of the line defects 535.

Figure 5D:
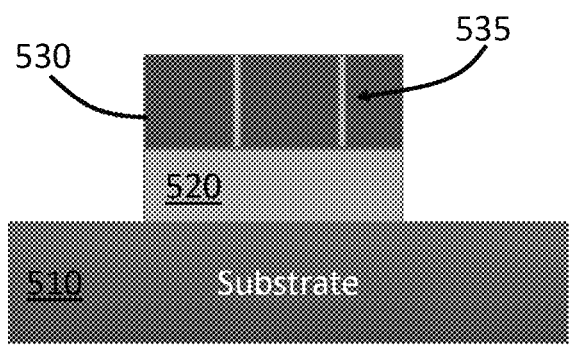

In FIG. 5D, the assembly of the conductive layer 520 and the crystalline layer 530 are etched into isolated islands (one island is shown in FIG. 5D), each of which can be fabricated into an individual switching cell. In this manner, the method 500 can produce multiple switching devices simultaneously, thereby allowing mass production or at least batch fabrication. The etching step shown in FIG. 5D can be, for example, dry etching or wet etching as known in the art.

Figure 5E:
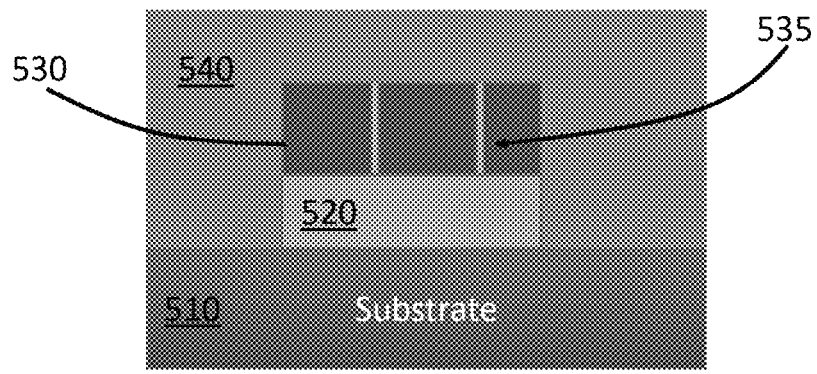

FIG. 5E shows that an insulating layer 540 is disposed on and around the assembly of the conductive layer 520 and the crystalline layer 530. In other words, the insulating layer 530 surrounds the conductive layer 520 and the crystalline layer 530. The insulating layer 530 can be disposed via conformal coating or deposition techniques, such as atomic layer deposition (ALD), chemical vapor deposition, or any other conformal coating methods known in the art.

Figure 5F:
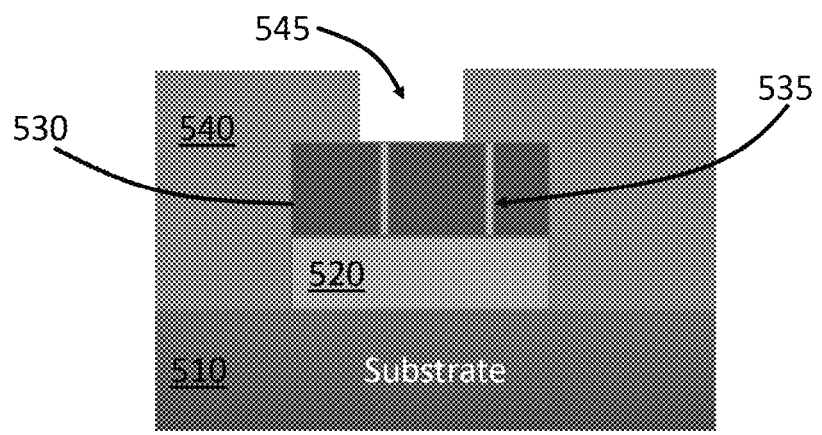
Figure 5G:
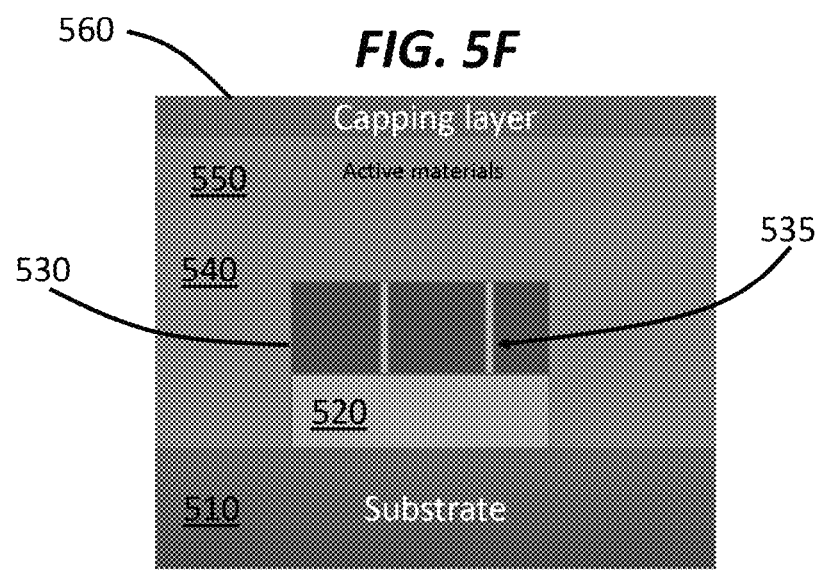

FIG. 5F shows that an opening 545 is created in the insulating layer 540 to expose at least one line defect 535 for further processing. The opening 545 can be created via dry etching or wet etching. An active material is then disposed into the opening 545 so as to form an active electrode 550, as shown in FIG. 5G. Optionally, a capping layer 560 can be disposed on the active electrode 550. In practice, the capping layer 560 can block undesired diffusion of active materials such as Ag.

The active electrode 550 as shown in FIG. 5G not only fills the opening 545 in the insulating layer 540 but also covers on top of a significant portion of the insulating layer 540. In this case, the switching devices that are batch fabricated can share a common active electrode 540. Alternatively, the active electrode 550 can be an individual active electrode 550 electrically connected only to the crystalline layer 530 right below but not adjacent crystalline layers (see, e.g., FIG. 6G below).

Figure 6A:
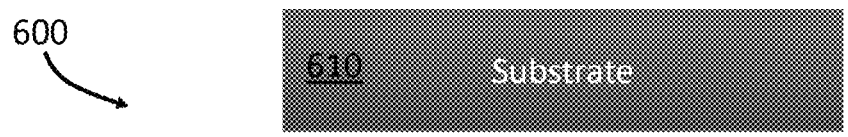
FIGS. 6A-6G illustrate a method of fabricating an array of electrical switch apparatus with an individual active electrode for each electrical switch apparatus in the array.
Figure 6B:
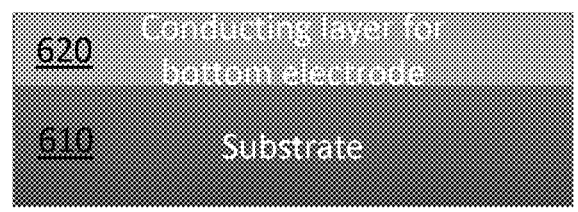
Figure 6C:
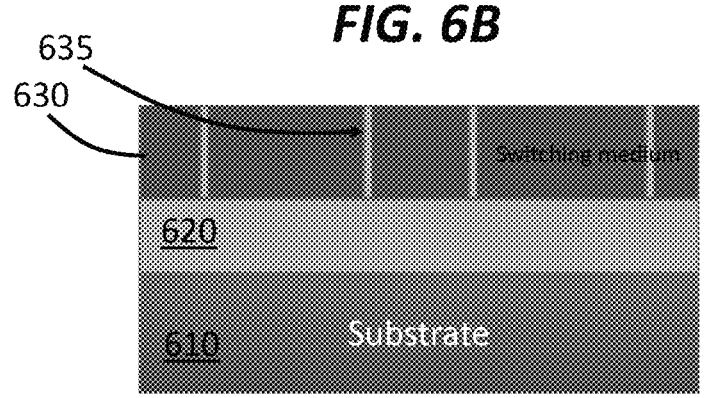
Figure 6D:
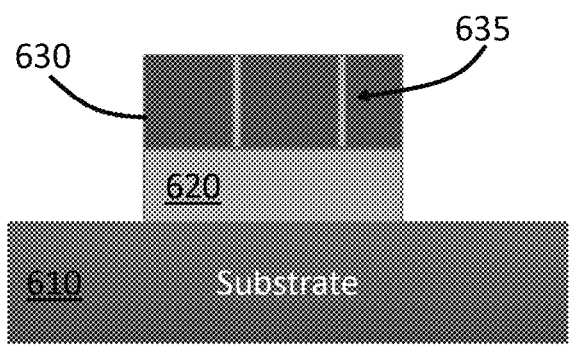
Figure 6E:
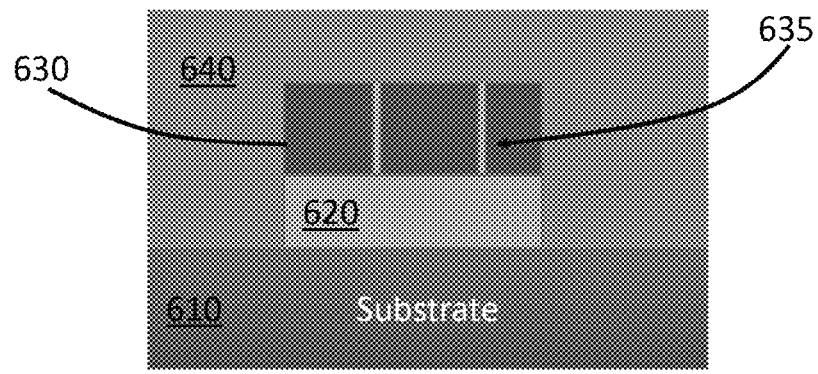
Figure 6F:
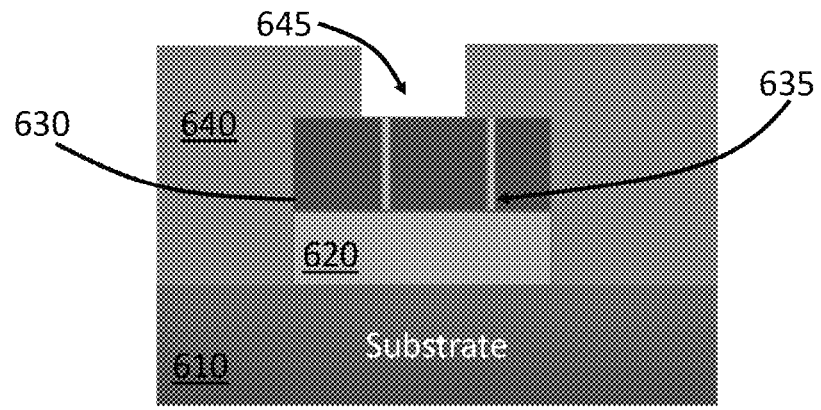

FIGS. 6A-6G illustrate a method 600 of fabricating an array of switching devices and each individual switch device in the array has an individual active electrode. The first steps of method 600 as illustrated in FIGS. 6A-6F are substantially similar to the first steps of the method 500 illustrated in FIGS. 5A-5F. In method 600, a substrate 610 is prepared (FIG. 6A) and a conductive layer 620 is disposed on the substrate 610 (FIG. 6B). A crystalline layer 630 is epitaxially grown on the conductive layer 620 (FIG. 6C). The lattice mismatch between the crystalline layer 630 and the conductive layer 620 creates line defects 635 in the crystalline layer 630, as well as controls the density of the line defects 635. In FIG. 6D, the conductive layer 620 and the crystalline layer 630 are segmented into individual assemblies via dry etching or wet etching. Each individual assembly of the conductive layer 620 and the crystalline layer 630 is surrounded by an insulating layer 640 as shown in FIG. 6E. An opening 645 is created for each individual assembly of the conductive layer 620 and the crystalline layer 630, as shown in FIG. 6F.

Figure 6G:
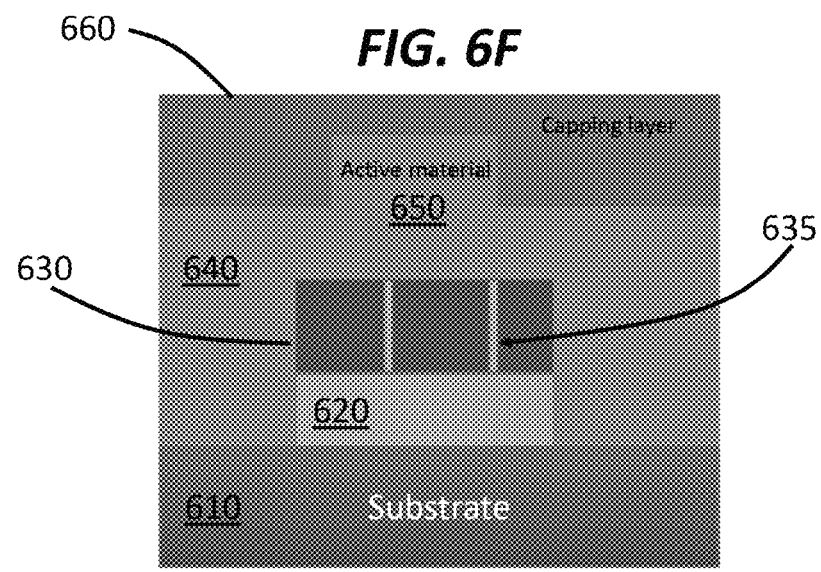

FIG. 6G shows that an active material is disposed in the opening 645 to form an active electrode 650. In contrast to the active electrode 550 shown in FIG. 5G, the active electrode 650 extends to only the proximity of the opening 645. In this case, each crystalline layer 630 can have an individual active electrode 650, instead of sharing a common active electrode with other switching devices on the substrate 610. An optional capping layer 660 can also be disposed on the active electrode 650 and the insulating layer 640.

Figure 7A:
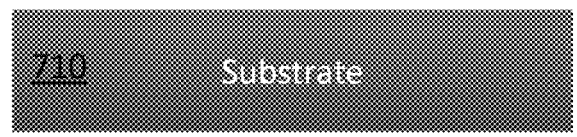
FIGS. 7A-7G illustrate a method of fabricating an array of electrical switch apparatus with compact individual active electrodes.
Figure 7B:
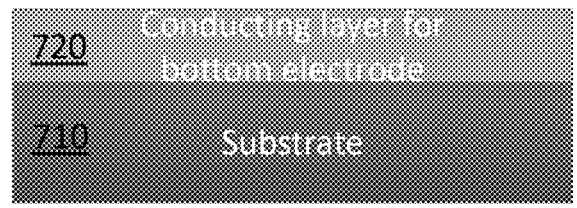
Figure 7C:
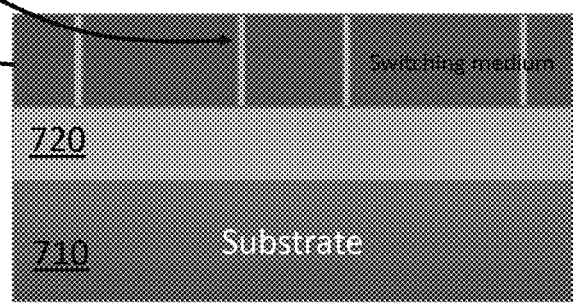
Figure 7D:
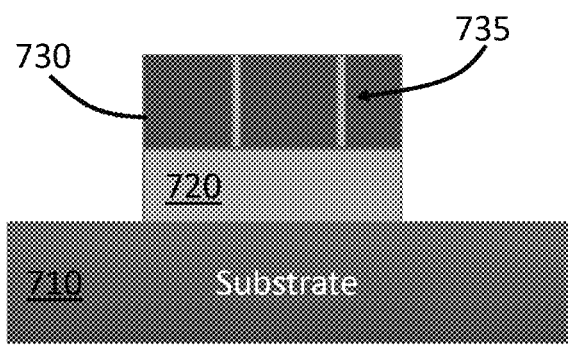

FIGS. 7A-7G illustrate a method 700 of fabricating an array of switching devices. Each switching device in the array has an individual active electrode that covers only the switching medium. The first steps of method 700 as illustrated in FIGS. 7A-7F are substantially similar to the first steps of the method 500 illustrated in FIGS. 5A-5F. In method 700, a substrate 710 is prepared (FIG. 7A) and a conductive layer 720 is disposed on the substrate 610 (FIG. 7B). A crystalline layer 730 is epitaxially grown on the conductive layer 720 (FIG. 7C). The lattice mismatch between the crystalline layer 730 and the conductive layer 720 creates line defects 735 in the crystalline layer 730, as well as controls the density of the line defects 735. In FIG.

Figure 7E:
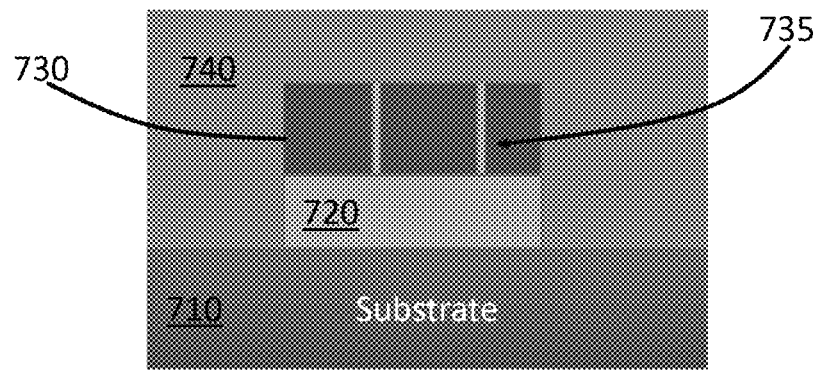

7D, the assembly of the conductive layer 720 and the crystalline layer 730 is segmented into individual assemblies via dry etching or wet etching. Each individual assembly of the conductive layer 720 and the crystalline layer 730 is surrounded by an insulating layer 740 as shown in FIG. 7E.

Figure 7F:
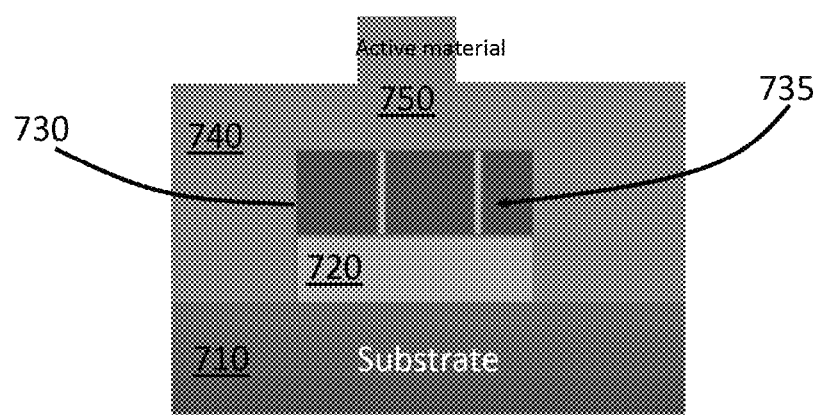
Figure 7G:
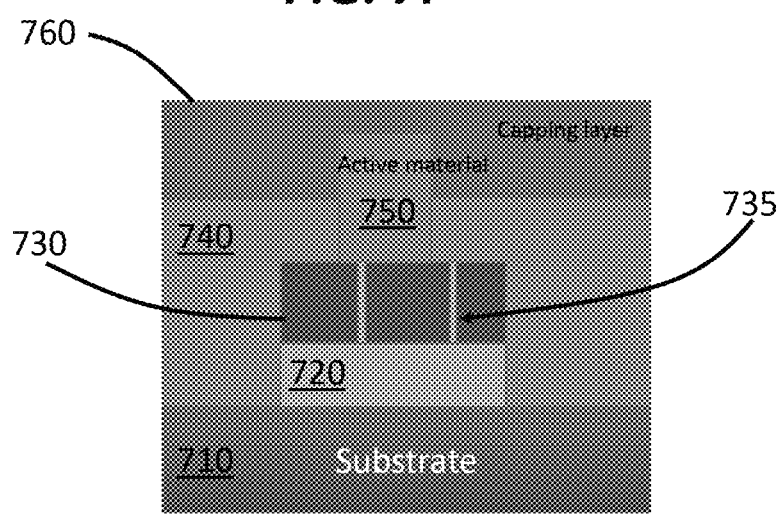

FIG. 7F shows that an opening 745 is created for each individual assembly of the conductive layer 720 and the crystalline layer 730. An active material is disposed in the opening 745 to form an active electrode 750, which extends vertically from the crystalline layer 730 and does not cover the top surface of the insulating layer 740. Compared to the active electrode 650 in FIG. 6G, the active electrode 750 can be more compact and may reduce the cost of the resulting devices by reducing the amount of active material. In FIG. 7G, a capping layer 760 is disposed on the active electrode 750 and the insulating layer 740. The capping layer 760 can be conductive so as to electrically couple together the individual active electrodes 750 in different individual switching devices.

Methods of Fabricating Switching Devices Based on Other Channels

Figure 8A:
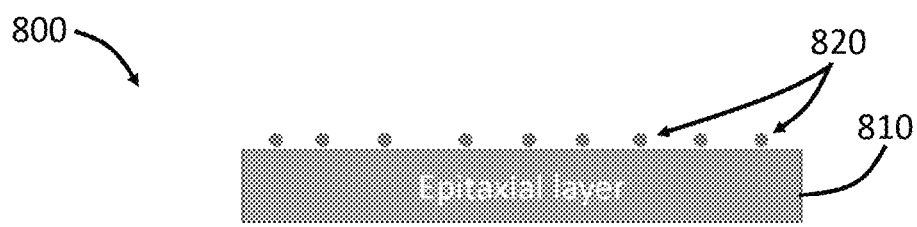
FIGS. 8A and 8B illustrate a method of fabricating switching medium via metal assisted etching.
Figure 8B:
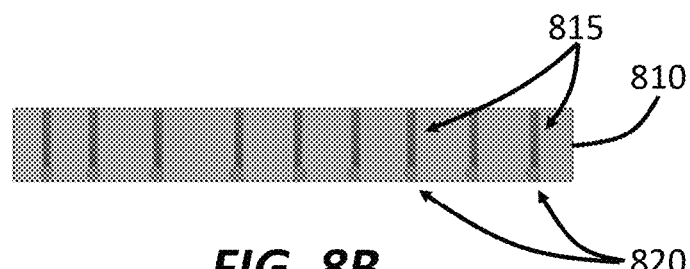

As described above, other channels in materials can also be used to facilitate the formation and confinement of conductive filaments. FIGS. 8A-8B illustrate a method 800 of creating channels in a switching medium using metal assisted etching. In FIG. 8A, metal nanoparticles 820 are disposed on a substrate 810, which can be an epitaxial layer. In one example, the metal nanoparticles 820 include gold nanoparticles. In another example, the metal nanoparticles 820 include silver nanoparticles. In yet another example, the metal nanoparticles 820 include copper nanoparticles. The size of the metal nanoparticles 820 can be about 1 nm to about 5 nm (e.g., about 1 nm, about 2 nm, about 3 nm, about 4 nm, or about 5 nm, including any values and sub ranges in between).

The metal nanoparticles 820 can be disposed on the substrate 810 via spin coating techniques. Optionally, the metal nanoparticles 820 can be covered with thiol-terminated polystyrene (e.g., forming a polymer shell surrounding each metal nanoparticle). The polymer shell can facilitate the formation of highly ordered arrays of metal nanoparticles 820 via self-assembly.

FIG. 8B shows that an etching process is carried out to etch the portion of the substrate 810 right underneath the metal nanoparticles 820 so as to form a plurality of channels 815. These channels 815 allow the formation and confinement of conductive filaments. Accordingly, the substrate 810 including the channels 815 can be used as switching medium. The etching can use a mixture of hydrogen fluoride (HF) and $H_2O_2$, as known in the art. An additional step can be performed to remove possible polymer shell surrounding the nanoparticles 820. In one example, the polymer shell can be removed by plasma treatment. In another example, the polymer shell can be removed by flame annealing.

The method 800 can further include the optional step of removing the metal nanoparticles 820 after the formation of the channels 815. The removal can be achieved by, for example room temperature etching in an aqueous solution of iodine and potassium iodide.

Figure 9:
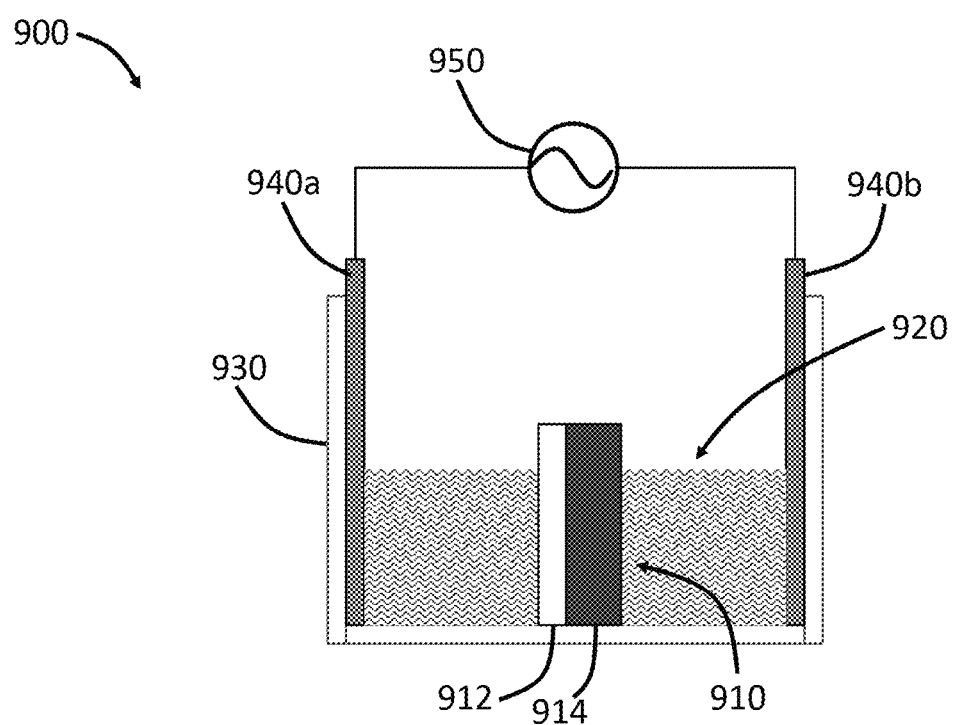
FIG. 9 illustrates a method of fabricating switching medium via electrochemical etching.

FIG. 9 illustrates a system 900 for fabricating porous silicon, which can also be used as switching medium as described above. The system 900 includes a container 930 to hold an electrolyte 920, such as HF-ethanol or HF—$H_2O_2$. A silicon sample 910 including an intrinsic silicon region 912 and a $p^+$ type silicon region 914 is at least partially immersed in the electrolyte 920. Two electrodes 940a and 940b are placed on two sides of the container 930 and are in direct contact with the electrolyte 920. A current source 950 is electrically coupled to the two electrodes 940a and 940b so as to perform electrochemical anodization of the silicon sample. Upon application of a current flowing through the electrolyte, pores can be created in the $p^+$ silicon region 914, which can then be used as the switching medium to create and confine conductive filaments in the pores.

Methods of Fabricating Switching Devices Using Assistive Metal Layers

Figure 10A:
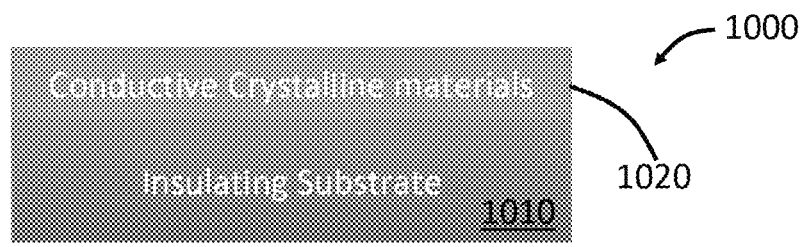
FIGS. 10A-10F illustrates a method of fabricating switching medium via using an assistive crystalline metal layer.
Figure 10B:
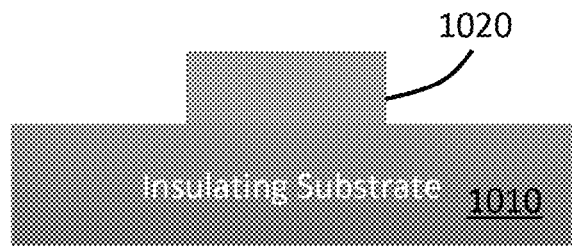
Figure 10C:
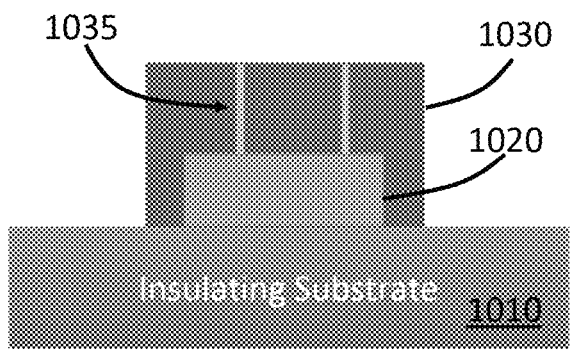
Figure 10D:
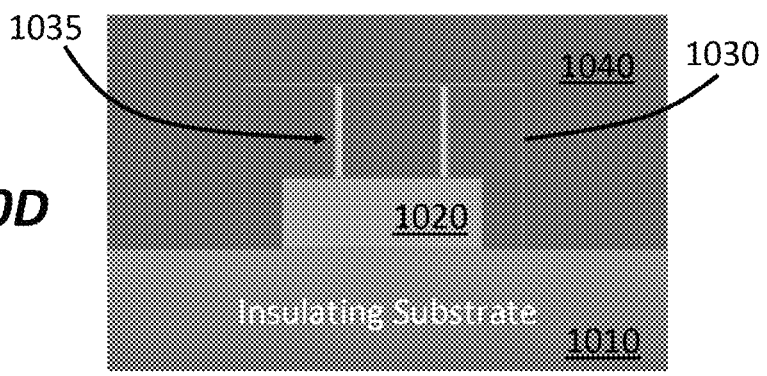
Figure 10E:
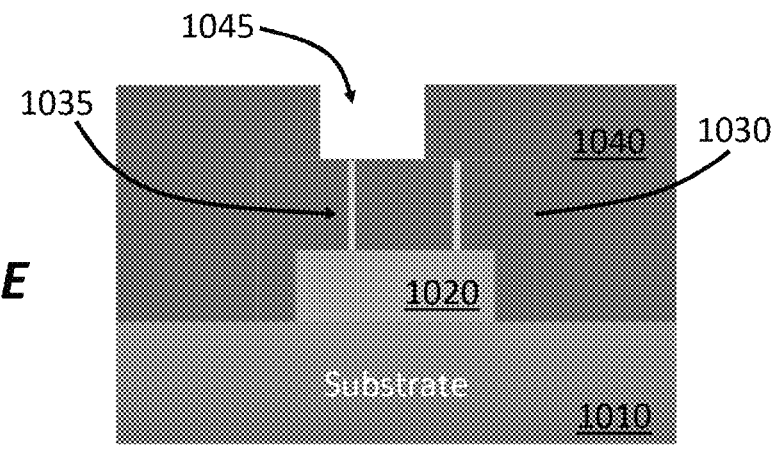
Figure 10F:
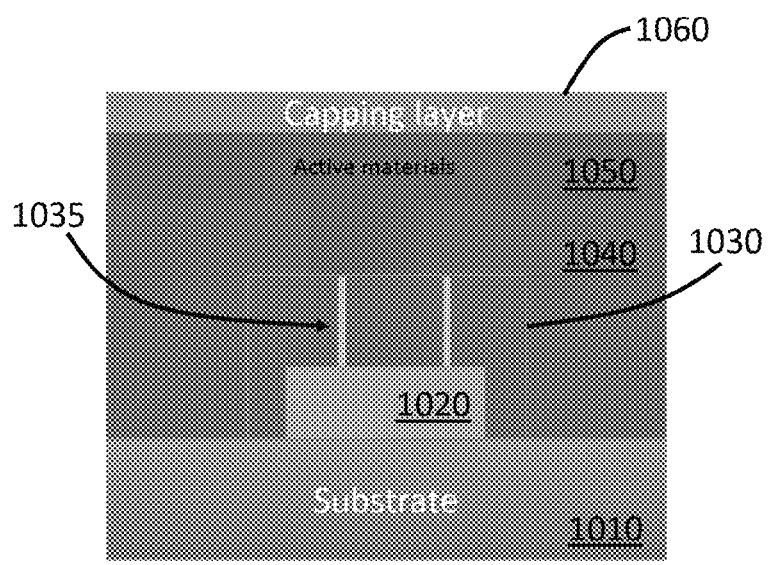

FIGS. 10A-10F illustrate a method 1000 of fabricating switching devices using assistive metal layers. FIG. 10A shows a conductive crystalline layer 1020 disposed on a substrate 1010 that can be insulating. FIG. 10B shows that the conductive crystalline layer 1020 is patterned so as to, for example, define areas for subsequent growth of switching medium. FIG. 10C shows that a crystalline layer 1030 is conformally deposited on the etched conductive crystalline layer 1020. The crystalline layer 1030 includes at least one line defect 1035. In FIG. 10D, an insulating layer 1040 is disposed on the crystalline layer 1030. The insulating layer 1040 can, for example, block direct electrical current from top electrode to the bottom electrode. In FIG. 10E, an opening 1045 is created in the insulating layer 1040 via wet etching or dry etching. The opening 1045 exposes at least one line defect 1035 so as to facilitate next steps. In FIG. 10F, an active material 1050 is filled in to the opening 1045 as well as disposed above the insulating layer 1040 so as to define a top electrode. An optional capping layer 1060 is then disposed on the active material 1050.

Figure 11A:
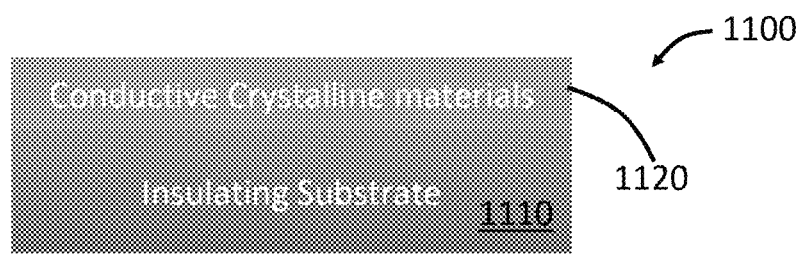
FIGS. 11A-11D illustrates a method of fabricating switching medium with active materials surrounding directly crystalline layers.
Figure 11B:
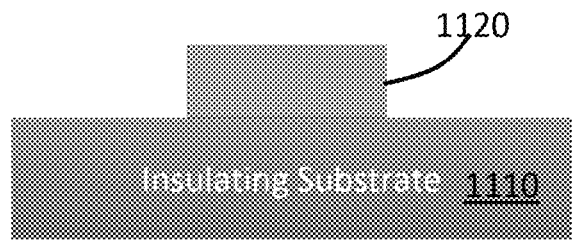
Figure 11C:
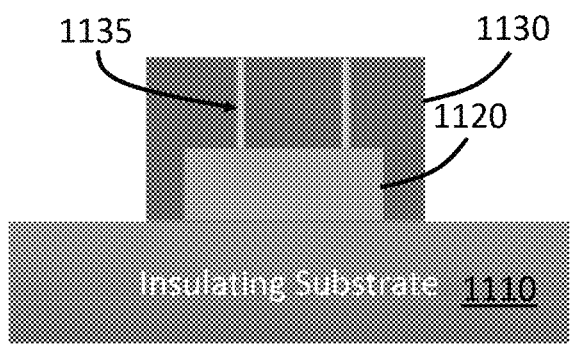
Figure 11D:
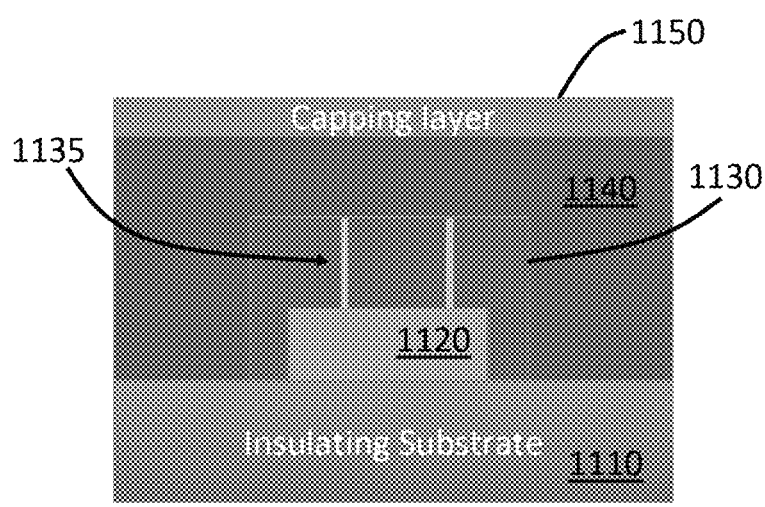

FIGS. 11A-11D illustrate a method 1100 of fabricating switching devices with active materials surrounding the crystalline layer. FIG. 11A shows a conductive crystalline layer 1120 disposed on a substrate 1110 that can be insulating. FIG. 11B shows that the conductive crystalline layer 1120 is patterned so as to, for example, define areas for subsequent growth of switching medium. FIG. 11C shows that a crystalline layer 1130 is conformally deposited on the etched conductive crystalline layer 1120. The crystalline layer 1130 includes at least one line defect 1135. In FIG. 11D, an active material 1140 is directly disposed on the crystalline layer 1130 and surround the entire crystalline layer 1130 to define a top electrode. An optional capping layer 1150 is then disposed on the active material 1140.

Characterization of Switching Devices Including Line Defects

Figure 12A:
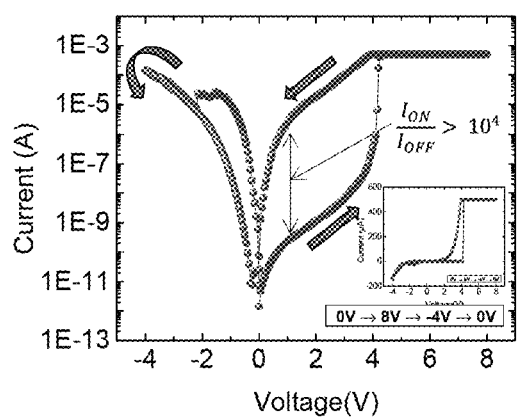
FIG. 12A is a current-voltage plot of a single switching operation in a switching device as shown in FIG. 1.

FIG. 12A is a representative current-voltage plot of a switching device as shown in FIG. 1. As can be seen from FIG. 12A, the switching device has a set voltage at around 4 volts. Upon removal of the voltage, the current stays high, demonstrating that the switching device is nonvolatile. Applying a reverse voltage can then set the switching device back to an OFF state (high resistivity). FIG. 12A also shows that the switching device has an ON/OFF ratio greater than $10^4$.

Figure 12B:
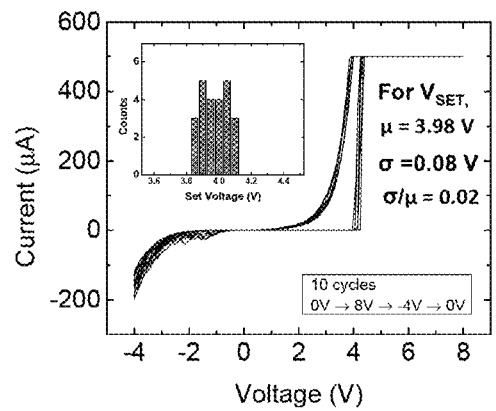
FIG. 12B shows current-voltage plots of multiple cycles of operation of switching device of FIG. 1.

FIG. 12B shows current-voltage plots of the switching device after multiple cycles of writing and erasing. The average set voltage μ is about 3.98 V and the variation a is about 0.08 V. The uniformity of the switching device can be defined as σ/μ, which is as low as 0.02.

Figure 12C:
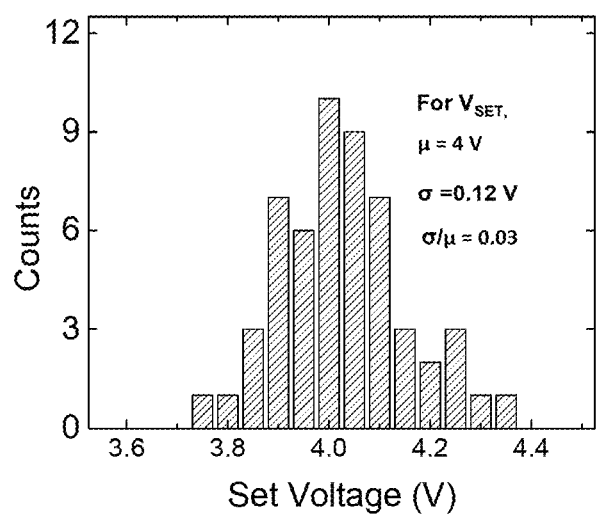
FIG. 12C shows distribution of set voltages in multiple switching devices to demonstrate device-to-device uniformity.

FIG. 12C shows distribution of set voltages among different switching devices to illustrate device-to-device uniformity. The average set voltage μ is about 4 V and the variation a is about 0.12 V. The uniformity of the switching devices can similarly be defined as σ/μ, which is as low as 0.03. In contrast, conventional switching devices usually have a uniformity (σ/μ) on the order of 0.08 or greater.

FIG. 12D is plot showing the electrical current at ON and OFF states after more than 4.5 hours of continuous operation. Both the ON current and OFF current maintain a stable value without noticeable reduction. The ON/OFF ratio has also stayed at a level greater than $10^5$ over the entire testing period.

FIG. 12E is a plot of conductance as a function of compliance current of the switching device, demonstrating multi-level storage capability from self-limiting filament growth by current-compliance. FIG. 12E is the result of using different current compliance values. The external current compliance can regulate the conductivity of the filament and offer multi-level current levels. Multi-level currents, in turn, can provide multiple-level storage capabilities.

Figure 12F:
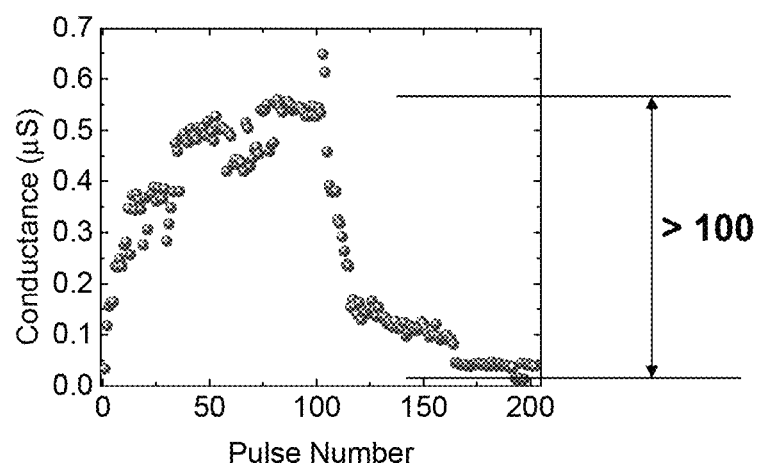
FIG. 12F is a plot showing conductance as a function of pulse number of the switching device shown in FIG. 1.

FIG. 12F is a plot showing conductance as a function of pulse number of a switching device shown in FIG. 1. The analog switching behavior of the device can offer an effective implementation of synaptic functions. The devices also show large dynamic ranges with easier access to the intermediate states that are suitable for neuromorphic computing applications. FIG. 12 is the result of pulse train of 100 set pulses followed by 100 reset pulses with non-perturbative read voltages applied in between every set/reset pulse. The conductance is measured during the read pulse and plotted as a function of applied read pulse number. FIG. 12F shows continuous conductance change that is capable of multi-level storage.

Figure 13A:
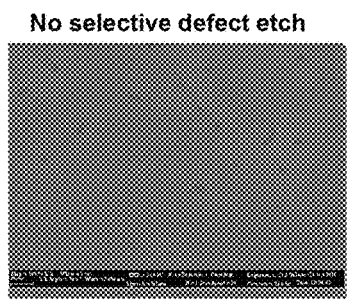
FIGS. 13A-13C are scanning electron microscope (SEM) images of a crystalline layer after different amount of selective etching, demonstrating the control over the size of the line defects.
Figure 13B:
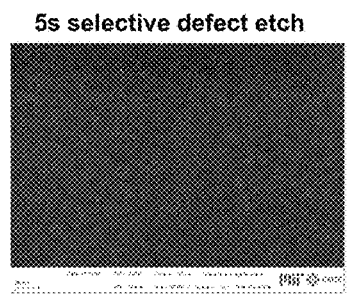
Figure 13C:
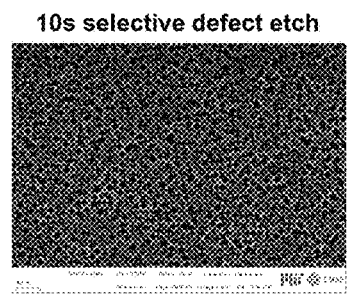

FIGS. 13A-13C are scanning electron microscope (SEM) images of a crystalline layer after different amounts of selective etching, demonstrating the control over the size of the line defects. As the etching time increases from 0 seconds (no etching, FIG. 13A) to 5 seconds (FIG. 13B) and then to 10 seconds (FIG. 13C), the lateral size (diameter) of the line defects noticeably increases.

Figure 14:
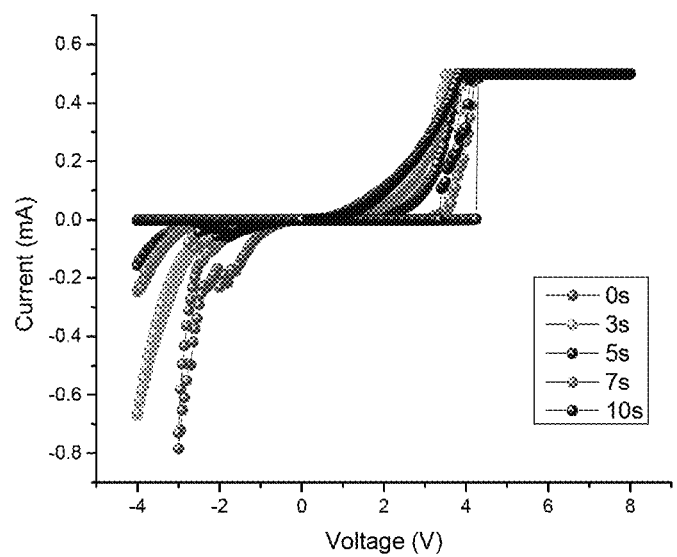
FIG. 14 show current-voltage plots of switching devices using crystalline layers made with different selective etching times.

FIG. 14 show current-voltage plots of switching devices using crystalline layers after different amounts of selective etching. In other words, FIG. 14 show current-voltage plots of switching devices with different size line defects in the crystalline layer. It can be seen that a longer period of selective etching can result in less leakage current at negative bias regime. This in turn means less sneak path in the switching medium.

Figure 15A:
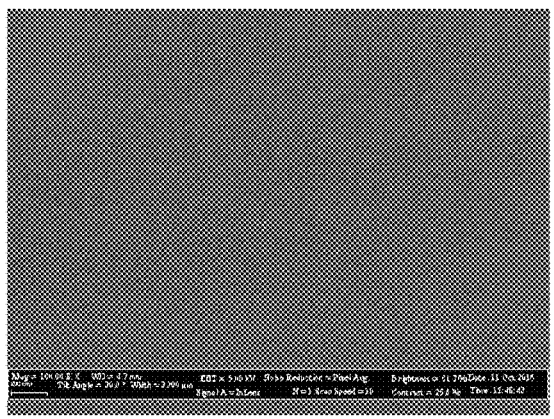
FIGS. 15A and 15B are SEM images of crystalline SiGe films having different percentages of germanium.
Figure 15B:
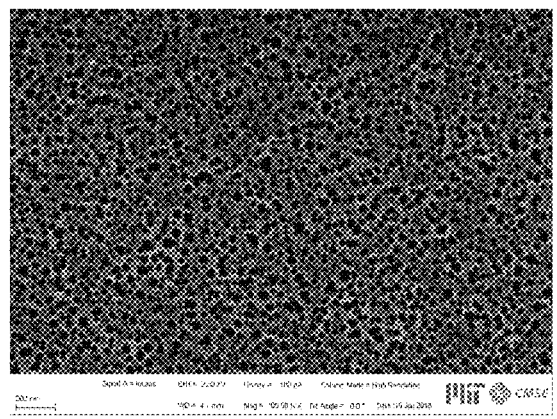

FIGS. 15A-15B are SEM images of crystalline layers having different lattice mismatches with respect to the silicon substrate on which the crystalline layers are epitaxially grown. FIG. 15A shows a SiGe layer having 10% germanium and FIG. 15B shows a SiGe layer having 30% germanium. A higher portion of germanium in the SiGe film means a larger lattice mismatch between the SiGe film and the silicon substrate. Therefore, FIGS. 15A-15B show that a lower Ge percentage in SiGe film can produce a smaller dislocation density.

Applications of Electrical Switching

The electrical switching described in this application can have various applications. For example, the electrical switching can be used as memory which in turn is ubiquitous in computers, tablets, smart phones, solid state drives (SSDs), and thumb drives, among other devices.

In another example, the electrical switching can be used for battery applications. The conducting filament can be used as solid state battery because it can store ionic materials such as lithium. In this case, the switching occurs via ion movement. In battery application, the battery can also operate by exchanging ions between cathode and anode.

The electrical switching can also be used in neuromorphic computing applications. It is usually desirable for neuromorphic computing to have long retention, good endurance, high on/off current ratio, and good uniformity, which are all present in the electrical switching described herein.

Figure 16:
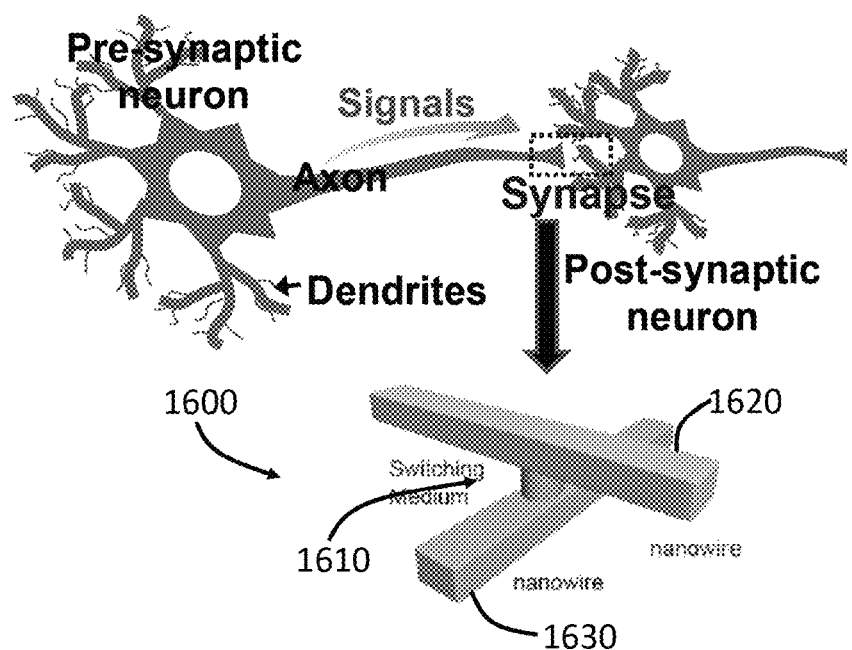
FIG. 16 illustrates a switching cell in neuromorphic computing.

FIG. 16 illustrates a schematic of a switching cell 1600 for neuromorphic computing. The switching cell 1600 includes a switching medium 1610 disposed between two nanowires 1620 and 1630. The two nanowires can simulate two neurons and the switching medium 1610 can simulate the path between the two neuros. The analog switching behavior of the switching cell 1600 can effectively implement synaptic functions and enable efficient neuromorphic systems. The high ON/OFF current ratio (e.g., see FIG. 12A and FIG. 12D) with long retention and endurance (e.g., see FIG. 12D) are also suitable for large-array neuromorphic computing and demonstration of basic synaptic learning rules such as spike-timing-dependent plasticity (STDP).

Figure 17:
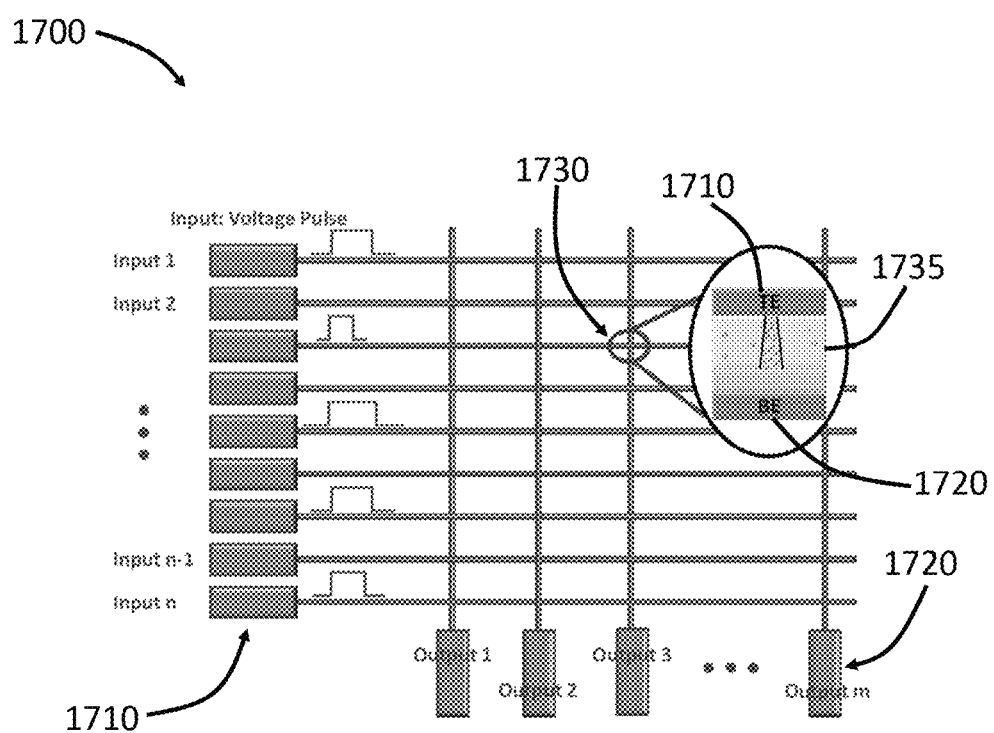
FIG. 17 shows a schematic of a large array of switching cells for neuromorphic computing.

FIG. 17 shows a schematic of a system 1700 including a large array of switching cells for neuromorphic computing. The system 1700 includes an array of horizontal electrodes 1710 and an array of vertical electrodes 1720 disposed at different heights. Each cross section of one horizontal electrode 1710 and one vertical electrode 1720 defines a switching cell 1730. At each switching cell 1730, as shown in the inset, a switching medium 1735 is disposed between one horizontal electrode 1710 and a vertical electrode 1720. The switching medium 1735 can include, for example, a crystalline layer with line defects (e.g., crystalline layer 110), a porous silicon layer, a substrate having artificially created channels, or anodized aluminum.

Figure 18:
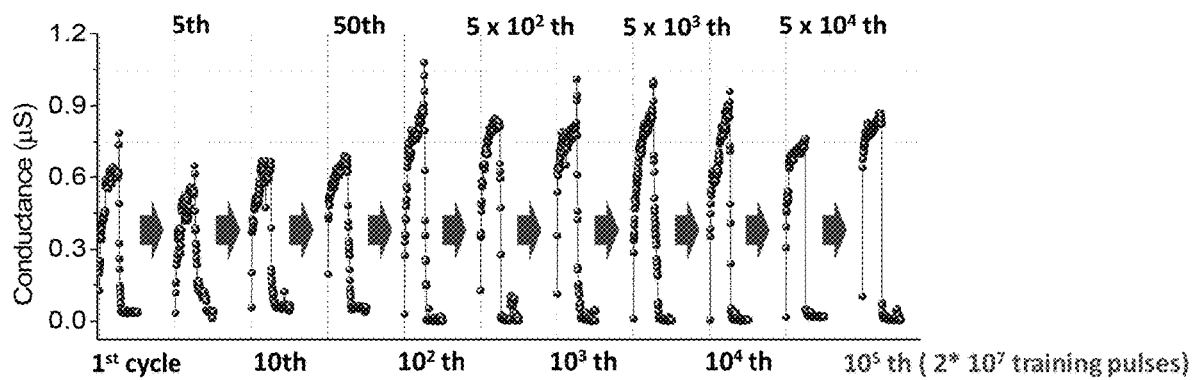
FIG. 18 shows conductance of the switching cells shown in FIG. 17 after multiple cycles of operations.

FIG. 18 shows conductance of the switching cells 1730 after multiple cycles of operations. The conductance curves substantially maintain the same shape after more than $10^7$ pulses, demonstrating the superior endurance of the switching cells 1730 and their suitability in neuromorphic computing.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the technology disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of," "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of actuating a device comprising a crystalline layer having at least one channel extending from a first side of the crystalline layer to a second side of the crystalline layer, a first electrode comprising an active material disposed on the first side of the crystalline layer, and a second electrode disposed on the second side of the crystalline layer, the method comprising:
    applying a first voltage, having a first sign, across the first electrode and the second electrode, the first voltage causing a plurality of metal ions of the active material to form a conductive filament extending between the first electrode and the second electrode along the at least one channel.

2. The method of claim 1, further comprising:
    applying a second voltage, having a second sign opposite to the first sign, between the first electrode and the second electrode to cause the plurality of metal ions to retreat back to the first electrode.

3. The method of claim 1, wherein the first voltage is about 4 V to about 6 V.

4. The method of claim 1, further comprising:
    maintaining the conductive filament in the at least one channel upon removal of the first voltage.

5. The method of claim 1, wherein the crystalline layer comprises a semiconductor.

6. The method of claim 5, wherein the semiconductor comprises at least one of a group IV semiconductor, a group III-V semiconductor, a group III-Nitride semiconductor, or a group II-VI semiconductor.

7. The method of claim 1, wherein the active material comprises at least one of Ag, Al, Au, Cu, In, Sn, or Zn.

8. The method of claim 1, wherein the first electrode has a solid solubility less than 1% in the crystalline layer.

9. The method of claim 1, wherein the second electrode has a solid solubility less than 1% in the crystalline layer.

10. A method of fabricating an electrical switching device, the method comprising:
    forming a crystalline layer on a conductive substrate, the crystalline layer having a first side on the conductive substrate and a second side opposite the first side, the crystalline layer having at least one channel extending from the first side to the second side;
    forming an electrode, comprising an active material, on the second side of the crystalline layer, the electrode having a first solid solubility less than 1% in the crystalline layer.

11. The method of claim 10, wherein forming the crystalline layer comprises epitaxially growing the crystalline layer on the conductive substrate.

12. The method of claim 11, wherein forming the crystalline layer comprises selecting the conductive substrate to have a lattice mismatch with respect to the crystalline layer so as to fabricate the at least one channel comprising at least one line defect.

13. The method of claim 12, wherein the at least one line defect comprises a plurality of line defects, and wherein forming the crystalline layer further comprises:
    changing the lattice mismatch between the conductive substrate and the crystalline layer to change an area density of the plurality of line defects.

14. The method of claim 13, wherein forming the crystalline layer further comprises:
    changing a lateral dimension of the at least one line defect via selective etching.

15. The method of claim 14, wherein the selective etching comprises at least one of Schimmel etching or Secco etching.

16. The method of claim 10, further comprising:
    forming a resistive layer between the crystalline layer and the conductive substrate, the resistive layer comprising an intrinsic semiconductor.

17. The method of claim 10, further comprising:
    forming a blocking layer between the crystalline layer and the first electrode, the blocking layer comprising a doped semiconductor such that the blocking layer and the crystalline layer form a p-n junction.

18. The method of claim 10, wherein the crystalline layer comprises a semiconductor.

19. The method of claim 18, wherein the semiconductor comprises at least one of a group IV semiconductor, a group III-V semiconductor, a group III-Nitride semiconductor, or a group II-VI semiconductor.

20. The method of claim 10, wherein the active material comprises at least one of Ag, Al, Au, Cu, In, Sn, or Zn.

* * * * *